US009950463B2

(12) United States Patent
Ishikawa et al.

(10) Patent No.: US 9,950,463 B2
(45) Date of Patent: Apr. 24, 2018

(54) IMPRINTING DEVICE

(71) Applicant: Panasonic Intellectual Property Management Co., Ltd., Osaka (JP)

(72) Inventors: Akihiro Ishikawa, Osaka (JP); Teppei Iwase, Hyogo (JP); Toshihiko Wada, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 267 days.

(21) Appl. No.: 14/990,785

(22) Filed: Jan. 7, 2016

(65) Prior Publication Data
US 2016/0257062 A1 Sep. 8, 2016

(30) Foreign Application Priority Data

Mar. 2, 2015 (JP) ................. 2015-039737

(51) Int. Cl.
| B29C 59/04 | (2006.01) |
| B29C 59/00 | (2006.01) |
| B29C 59/02 | (2006.01) |
| G03F 7/00 | (2006.01) |
| B29K 101/12 | (2006.01) |
(Continued)

(52) U.S. Cl.
CPC ............ B29C 59/046 (2013.01); B29C 59/00 (2013.01); B29C 59/002 (2013.01); B29C 59/022 (2013.01); G03F 7/0002 (2013.01); B29C 37/0003 (2013.01); B29C 59/02 (2013.01); B29C 59/04 (2013.01); (Continued)

(58) Field of Classification Search
CPC ......... B29C 59/00; B29C 59/02; B29C 59/04; B29C 59/046; B29C 59/002; B29C 59/022; B29C 37/0003; B29C 2059/023; G03F 7/0002; B29K 2101/12; B29K 2105/24
USPC ................................ 425/174.4, 385
See application file for complete search history.

(56) References Cited

U.S. PATENT DOCUMENTS

| 2002/0125303 A1 | 9/2002 | Tokunaga et al. |
| 2009/0174118 A1 | 7/2009 | Maeda et al. |
(Continued)

FOREIGN PATENT DOCUMENTS

| JP | 2001-162476 | 6/2001 |
| JP | 2001162476 A * | 6/2001 |
(Continued)

OTHER PUBLICATIONS

JP2014054735A machine translation Jap to Eng (Year: 2014).*
JP2001162476A machine translation Jap to Eng (Year: 2001).*

Primary Examiner — Matthew J Daniels
Assistant Examiner — Lawrence D. Hohenbrink, Jr.
(74) Attorney, Agent, or Firm — Panasonic IP Management; Kerry S. Culpepper

(57) ABSTRACT

An imprinting device capable of realizing uniform transfer regardless of the thickness of a substrate includes a stage having a placement area for placing a substrate to which a transferred object is applied, a thin-plate mold with flexibility having a fine pattern on a first surface facing the placement area of the stage, which is held with a predetermined tension and a pressing roll which can press a second surface opposite to the first surface of the mold, in which the stage has plural adsorption holes around the placement area, and the adsorption holes start adsorption in synchronization with movement of the pressing roll.

4 Claims, 11 Drawing Sheets

(51) Int. Cl.
*B29K 105/24* (2006.01)
*B29C 37/00* (2006.01)
*B29C 35/08* (2006.01)

(52) U.S. Cl.
CPC *B29C 2035/0827* (2013.01); *B29C 2059/023* (2013.01); *B29K 2101/12* (2013.01); *B29K 2105/24* (2013.01)

(56) References Cited

U.S. PATENT DOCUMENTS

| | | |
|---|---|---|
| 2010/0059904 A1 | 3/2010 | Kasumi |
| 2014/0338813 A1 | 11/2014 | Ookawa |
| 2016/0039126 A1* | 2/2016 | Tan .................. G03F 7/0002 264/40.5 |

FOREIGN PATENT DOCUMENTS

| | | |
|---|---|---|
| JP | 2014-054735 | 3/2014 |
| JP | 2014054735 A * | 3/2014 |

* cited by examiner

IMPRINTING DEVICE

TECHNICAL FIELD

The technical field relates to an imprinting device forming a fine pattern.

BACKGROUND

In recent years, in optical components used for products such as a display and a lighting device, it is desirable to realize a device having the expression of an unprecedented new function which controls reflection and diffraction of light by forming a fine pattern (from nanometer (nm) order to micron (μm) order) exerting particular optical characteristics. As methods for forming the fine pattern, an imprinting technique is attracting attention recently in addition to a photolithography technique and an electron beam lithography technique. The imprinting technique is a technique of transferring the fine pattern of a mold by pressing the mold in which the fine pattern is formed on the surface onto a transferred object.

As specific methods, there are a thermal imprinting method and a UV imprinting method. The thermal imprinting method includes a process of applying a thermoplastic resin as a transferred object on a substrate and heating the thermoplastic resin to be higher than a glass transition temperature to soften the thermoplastic resin, a process of pressing a mold onto the softened thermoplastic resin to transfer the fine pattern of the mold and a process of cooling the thermoplastic resin to be cured.

The UV imprinting method includes a process of applying a UV curing resin as a transferred object on a substrate and pressing a mold onto the uncured UV curing resin to transfer the fine pattern of the mold and a process of curing the UV curing resin by irradiating the UV curing resin with a UV light while pressing the mold.

Although the thermal imprinting method has an advantage that the selectivity in the material of the transferred object is wide, there is a disadvantage that the throughput is low as the heating process and the cooling process of the thermoplastic resin are necessary. On the other hand, in the UV imprinting method, the selectivity in the material is narrower than that of the thermal imprinting method as the material of the transferred object is limited to the UV curing resin. However, the heating process and the cooling process are not necessary and the transfer can be completed for several seconds to several tens of seconds, therefore, the throughput is extremely high. Which of the thermal imprinting method and the UV imprinting method is adopted depends on devices to which the method is applied. The UV imprinting method is considered to be suitable for the mass production method when there is no problem caused by the material.

As a method of forming the fine pattern, a flat-plate imprint is in common use, in which a flat-plate mold 30 in which a fine pattern 33 is formed is vertically pressurized with respect to a resin 70 applied on a surface of a substrate 71 to thereby transfer the fine pattern 33 of the mold 30 to the resin 70 as shown in FIG. 9.

However, as a surface of the mold 30 contacts a surface of the resin 70 in this method, it is highly likely that microbubbles remain inside the fine pattern 33 of the mold 30 and that a transfer defect occurs. In order to inhibit the transfer defect due to the bubbles, it is necessary to perform the imprinting under a vacuum environment. In that case, there are problems that costs for a vacuum apparatus are required and that the throughput is reduced as a fixed period of time is necessary for allowing the apparatus to reach a given degree of vacuum.

In JP-A-2014-54735 (Patent Document 1), a roll-type UV imprinting method as shown in FIG. 10 is adopted for solving the above problems. In this method, the thin-plate mold 30 in which the fine pattern 33 is formed is fed in a feeding direction X while pressurizing the mold 30 with respect to the UV curing resin 70 applied to the substrate 71 by a pressing roll 10, thereby sequentially transfer the fine pattern 33 of the mold 30 to the UV curing resin 70. The UV curing resin 70 is cured by being irradiated with a UV light 61 by a UV irradiator 60 installed behind the pressing roll 10.

In this method, the mold 30 is sequentially pressed onto the substrate 71 by moving the pressing roll 10, therefore, the air is easily released to the feeding direction X of the pressing roll 10 and the fine pattern 33 of the mold 30 can be formed without trapping the air inside the fine patterns 33. Furthermore, as a pressed area between the mold 30 and the substrate 71 has a line shape, the pressure for the transfer can be reduced. Additionally, as the processing can be performed under atmospheric pressure, a large-scale vacuum apparatus is not required.

SUMMARY

However, the imprinting method described in Patent Document 1 has a problem that, when there is a level difference at an end portion of the substrate 71, the mold 30 floats from the substrate 71 after the pressing roll 10 passes the end portion of the substrate 71 and the transfer of the fine pattern in the end portion of the substrate 71 is significantly deteriorated. For example, in the case where the substrate 71 is thicker than a plate 40 provided around the substrate 71 as shown in FIG. 11, there is a danger that the mold 30 is bent and floated from the substrate 71 as the stress by the pressing roll 10 is concentrated on a corner of the substrate 71. On the other hand, in the case where the substrate 71 is thinner than the plate 40, the mold 30 floats when the pressing roll 10 runs on a corner of the plate 40.

In view of the above, an imprinting device capable of realizing uniform transfer regardless of the thickness of the substrate is provided.

According to an embodiment, an imprinting device includes a stage having a placement area for placing a substrate to which a transferred object is applied, a thin-plate mold with flexibility having a fine pattern on a first surface facing the placement area of the stage, which is held with a predetermined tension and a pressing roll which can press a second surface opposite to the first surface of the mold. The stage has plural adsorption holes around the placement area, and the adsorption holes start adsorption in synchronization with movement of the pressing roll.

In the imprinting device, the adsorption holes start adsorption at the time when or just after the pressing roll passes the adsorption holes to thereby adsorb and hold the mold, therefore, it is possible to prevent the mold from floating in a step portion after the pressing roll passes an end portion of the substrate, which can realize uniform transfer regardless of the thickness of the substrate.

The imprinting device can further include a controller configured by instructions stored in a memory to turn on and off the adsorption holes to adjust the adsorbability.

DESCRIPTION OF EMBODIMENTS

Figure 1:
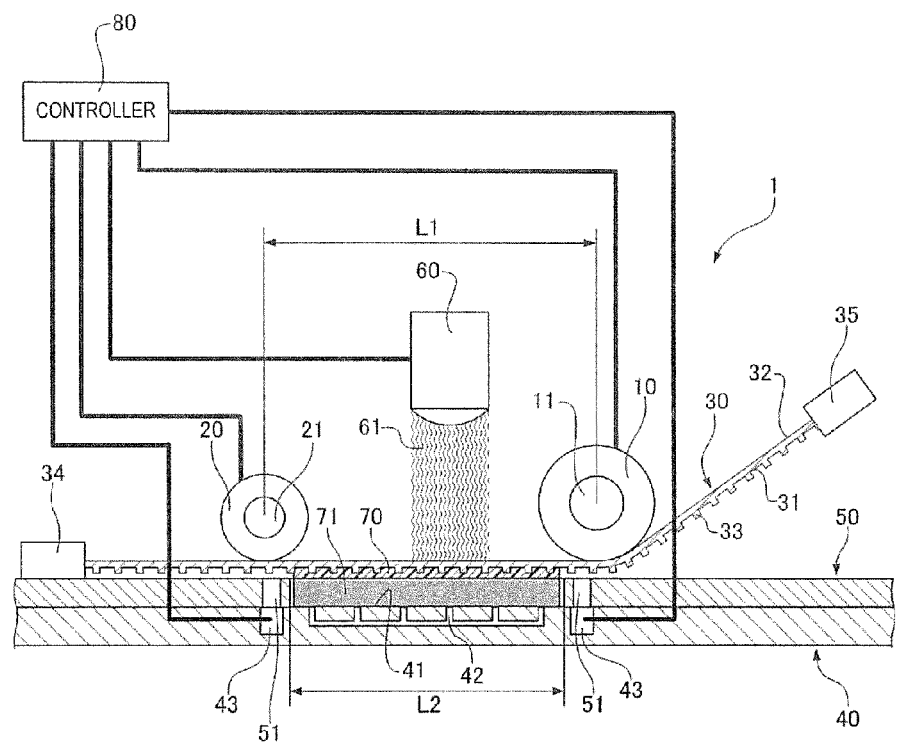
FIG. 1 is a side view of an imprinting device according to an embodiment.
Figure 1:
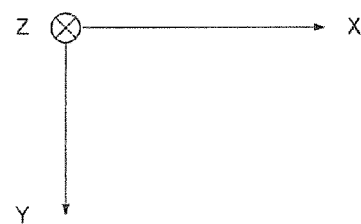

Hereinafter, a structure of an imprinting device according to an embodiment will be explained with reference to the drawings. As shown in FIG. 1, an imprinting device 1 according to the embodiment includes a pressing roll 10, a holding roll 20, a mold 30, a stage 40, a plate 50, a UV irradiator 60 and a controller 80. The imprinting device 1 according to the embodiment adopts a roll-type UV imprinting method.

The pressing roll 10 has a cylindrical shape, having a shaft 11 in the center thereof and rotating freely around the shaft 11. The pressing roll 10 can also move on a flat surface perpendicular to a direction of the shaft 11 (axial direction Z). In other words, the pressing roll 10 can move in a direction approaching the stage (pressing direction Y) and a direction perpendicular to the axial direction Z and the pressing direction Y (feeding direction X). The holding roll 20 also has a cylindrical shape, having a shaft 21 in the center thereof and rotating freely around the shaft 21. A direction of the shaft 21 is parallel to the axial direction Z of the pressing roll 10. The holding roll 20 can also move on the flat surface perpendicular to the axial direction Z in the same manner as the pressing roll 10. The holding roll 20 is held by, for example, a unit common to the pressing roll 10 and moves in synchronization with the movement of the pressing roll 10 while keeping a fixed interval L1 between the center of the shaft 21 of the holding roll and the center of the shaft 11 of the pressing roll 10. However, it is not necessary that the pressing roll 10 and the holding roll are held by the common unit, and may be held by different units as long as they move in synchronization with each other.

Figure 2:
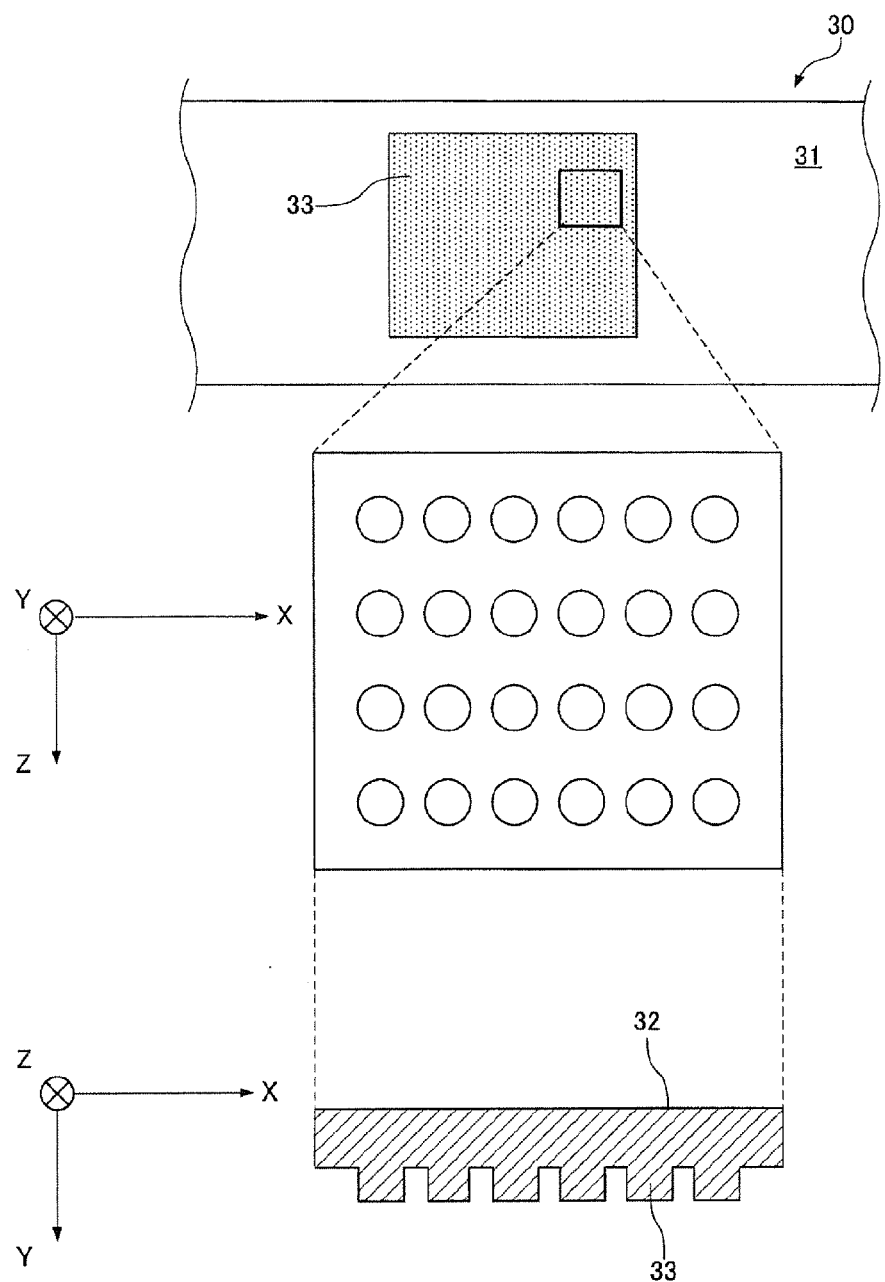
FIG. 2 shows a plan view and a cross-sectional view of a mold of the imprinting device.

The mold 30 has a thin-plate shape and is arranged between the pressing roll 10/the holding roll 20 and the stage 40 as shown in FIG. 1 and FIG. 2. The mold 30 has a first surface 31 facing the stage and a second surface 32 opposite to the first surface 31, and a fine pattern 33 is formed on at least part of the first surface 31. Although the case where the fine pattern 33 is formed on the entire surface of the mold 30 is shown in FIG. 1, the fine pattern 33 may be formed in a part of the mold 30 as shown in FIG. 2. One end of the mold 30 is held by a movable holding portion 34 and the other end thereof is held by a fixed holding portion 35. A tension applied to the mold 30 and an angle of the mold 30 with respect to the stage can be arbitrarily adjusted by moving the movable holding portion 34. The mold 30 is a material having UV transmittance and flexibility, which is, for example, a PET film, however, the material is not limited to that.

Figure 3:
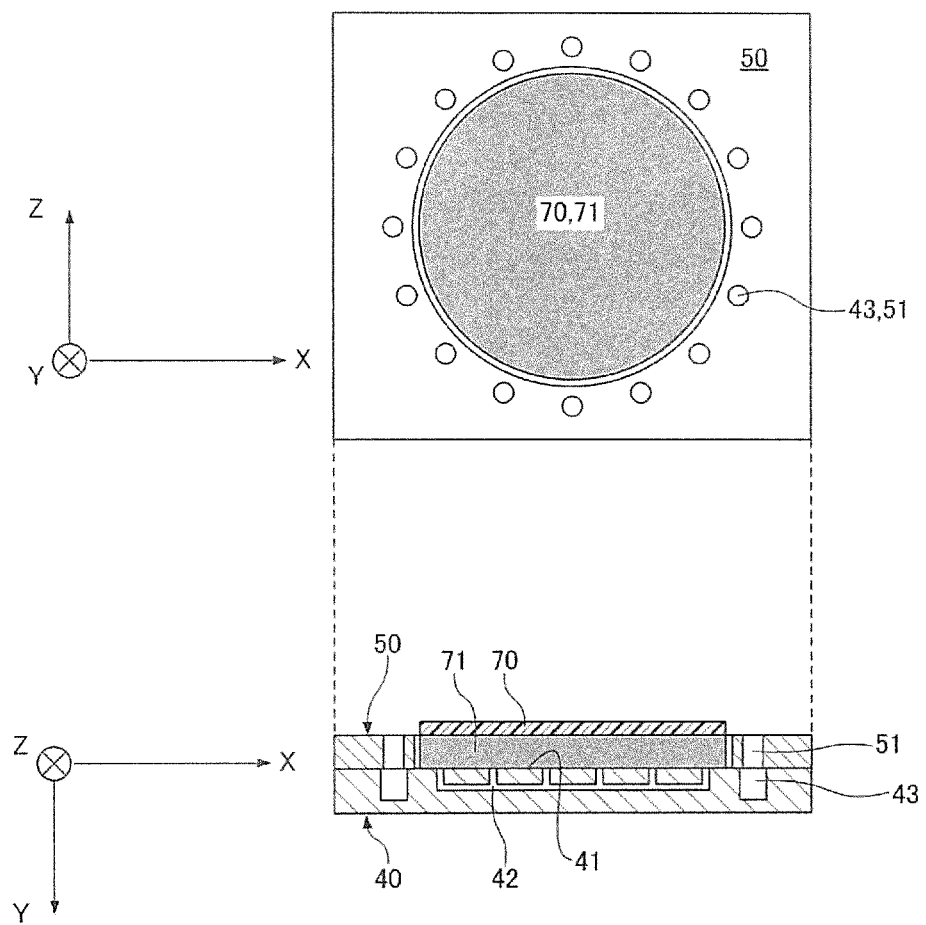
FIG. 3 shows a plan view and a cross-sectional view of a stage and a plate of the imprinting device.

The stage 40 has a placement area 41 for placing a substrate 71 to which a UV curing resin 70 as a transferred object is applied, and the placement area 41 faces the first surface 31 of the mold 30 as shown in FIG. 1 and FIG. 3. The interval L1 between the center of the shaft 11 of the pressing roll 10 and the center of the shaft 21 of the holding roll 20 is preferably set to be longer than a length L2 of the placement area 41 of the stage 40. Substrate adsorption holes 42 are formed in the placement area 41. Plural mold adsorption holes 43 are formed around the placement area 41. It is desirable that the mold adsorption holes 43 are independent of one another to allow a gas to be injected therefrom, the reason of which will be described later. It is also desirable that adsorbability and a flow rate of the gas can be adjusted.

A plate 50 is provided on an area except the placement area 41 on the stage 40 and a height thereof is approximately the same as a thickness of the substrate 71 to be used. In other words, a concave portion having approximately the same width and depth as the substrate 71 is formed by the stage 40 and the plate 50, and the substrate 71 is fitted to the concave portion. The plate 50 has plural through holes 51. The through holes 51 of the plate 50 are respectively connected to mold adsorption holes 43 on the stage 40.

The UV irradiator 60 is arranged on the second surface 32 side of the mold 30 at a position where the UV irradiator 60 can emit a UV light 61 which is collimated toward the stage 40 and where the emitted UV light 61 is not blocked by the holding roll 20 and the pressing roll 10. For example, the UV irradiator 60 applies the UV light 61 in the pressing direction Y of the pressing roll 10. In this case, the UV irradiator 60 is installed at a position where the UV irradiator 60 does not overlap with the pressing roll 10 and the holding roll 20 when seen from the pressing direction Y. The UV irradiator 60 is, for example, an LED, and is not limited to this.

Next, the imprinting method using the imprinting device 1 according to the embodiment will be explained. The pressing roll 10 and the mold adsorption holes 43 are respectively connected to the controller 80, and the controller 80 controls operation of the pressing roll 10 and the mold adsorption holes 43. It is also preferable that the controller 80 is also connected to the holding roll 20 and the UV irradiator 60 to also control the holding roll and the UV irradiator 60 as shown in FIG. 1.

First, the substrate 71 to which the uncured UV curing resin 70 is applied is placed on the placement area 41 of the stage 40 so that the UV curing resin 70 faces the mold 30. Accordingly, the substrate 71 is fitted to the concave portion formed by the stage and the plate 50. At this time, the substrate 71 is aligned in a predetermined position, being adsorbed and held on the placement area 41 of the stage 40 by the substrate adsorption holes 42. Then, the pressing roll 10 is moved in the pressing direction Y while holding the mold 30 with a predetermined tension and an angle. Accordingly, the pressing roll 10 contacts and presses the second surface 32 of the mold 30, and the mold 30 having flexibility is deformed along the movement of the pressing roll 10. When the pressing roll 10 moves in the pressing direction Y, the pressure is vertically applied to the substrate 71 placed on the stage 40. At this time, the magnitude of the pressure is measured by a load cell (not shown). When the measured pressure reaches a given pressure, the pressing roll 10 is moved in the feeding direction X. When the pressing roll 10 moves in the feeding direction X, the pressing roll 10 rotates by being affected by the friction force with respect to the second surface 32 of the mold 30. Then, the first surface 31 of the mold 30 sequentially contacts the UV curing resin 70 on the substrate 71, and the fine pattern 33 formed on the first surface 31 is sequentially transferred to the UV curing resin 70. The holding roll 20 shown in FIG. 1 moves in synchronization with the movement of the pressing roll 10 while keeping the fixed interval L1 with respect to the pressing roll 10.

Figure 4:
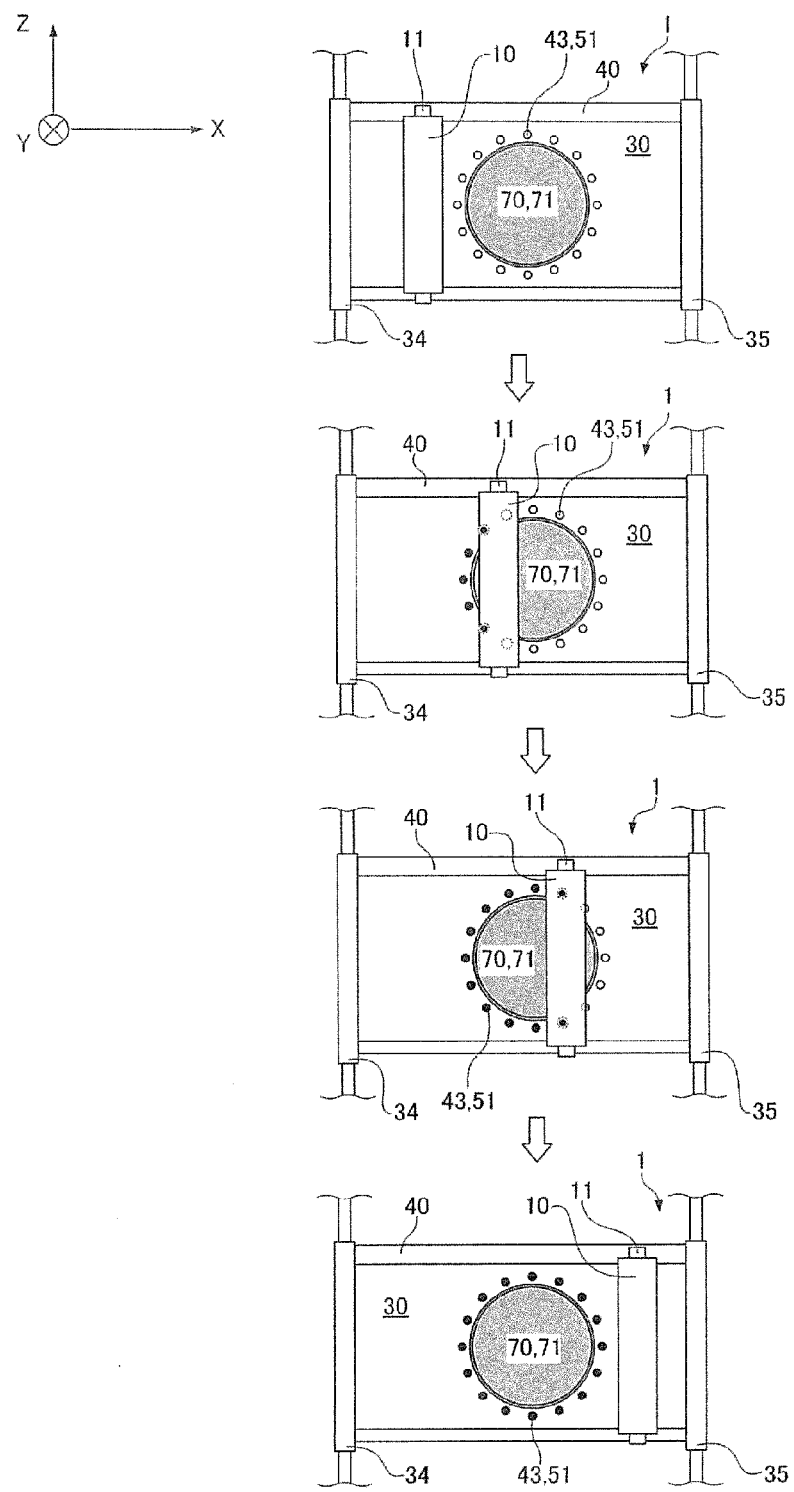
FIG. 4 shows plan views showing the operation of mold adsorption holes of the imprinting device.
Figure 5:
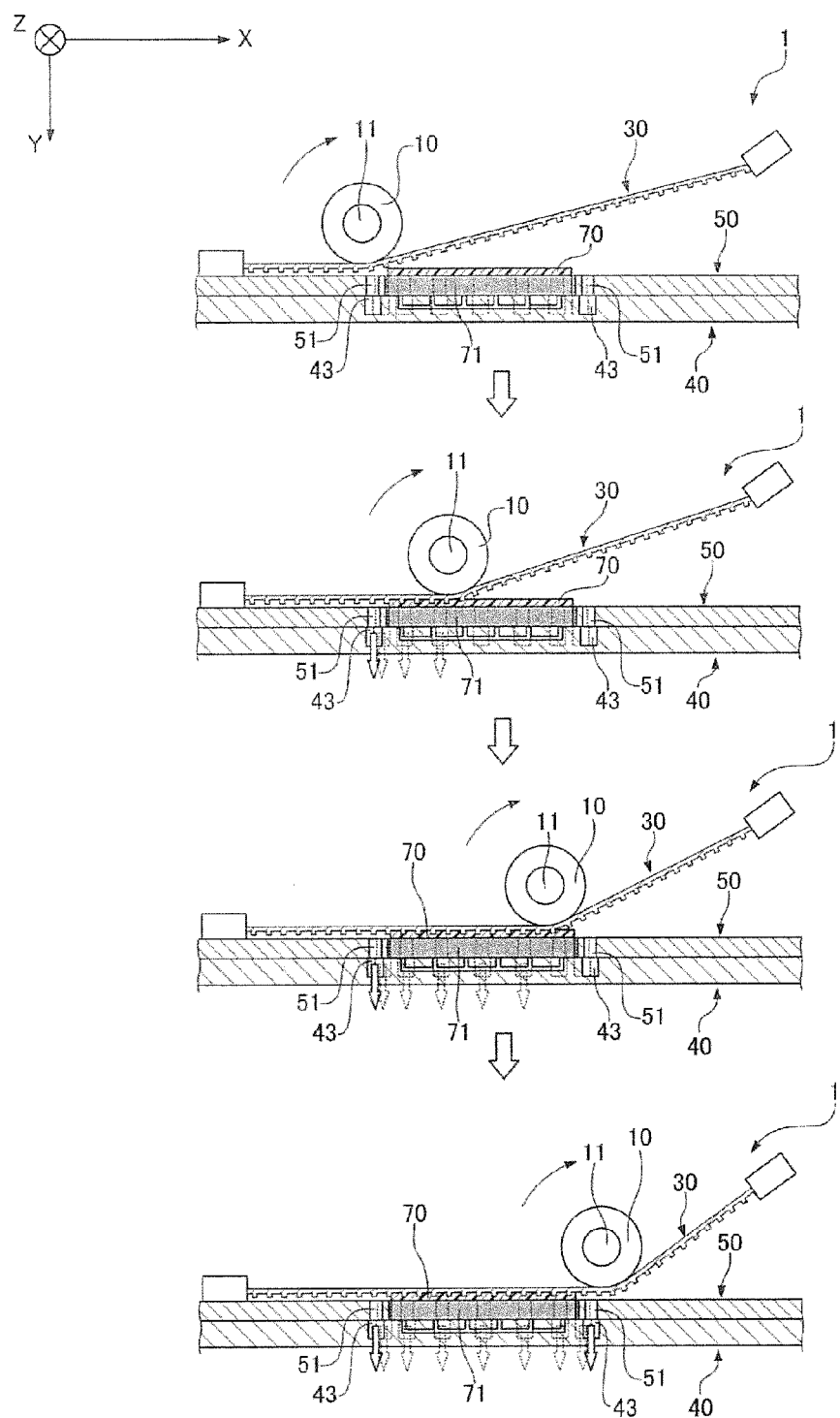
FIG. 5 shows cross-sectional views showing the operation of the mold adsorption holes of the imprinting device.

In this case, the mold adsorption holes 43 are configured to start adsorption in synchronization with the movement of the pressing roll 10 as shown in FIG. 4 and FIG. 5. As the mold adsorption holes 43 are respectively connected to the through holes 51 of the plate 50, when the mold adsorption holes 43 start adsorption, the mold 30 is adsorbed and held on the plate 50 through the through holes 51. Specifically, when the shaft 11 of the pressing roll 10 passes the mold adsorption holes 43, or just after passing the mold adsorption holes 43, the mold adsorption holes 43 are preferably turned on in order. In the plural mold adsorption holes 43 of FIG. 4, ones filled in white indicate an off-state of adsorption, and ones filled in black indicate an on-state of adsorption.

Suppose that the mold adsorption holes 43 are turned on before the shaft 11 of the pressing roll 10 passes the mold adsorption holes 43, the mold 30 contacts the UV cursing resin 70 before being pressurized by the pressing roll 10, which may mix bubbles and cause a transfer defect. When the mold adsorption holes 43 are turned on after the shaft 11 of the pressing roll 10 completely passes the mold adsorption holes 43, there is a danger that the mold 30 is deformed at a step portion between the substrate 71 and the plate 50 and that the fine pattern 33 is not transferred in an end portion of the substrate 71. The structure of the holding roll 20 shown in FIG. 1 is omitted in FIG. 4 to FIG. 8.

Figure 6:
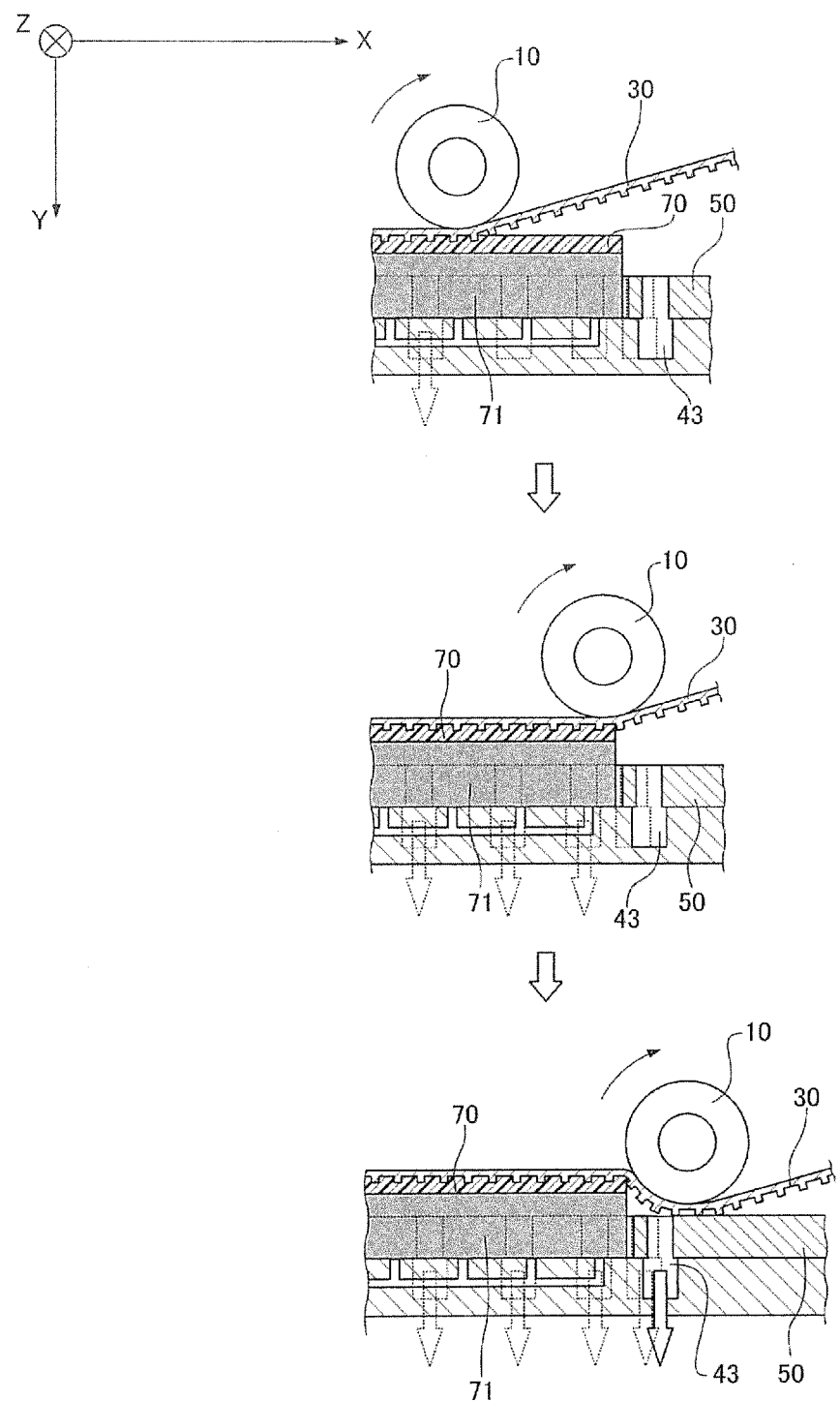
FIG. 6 shows enlarged cross-sectional views of the imprinting device in a case where a substrate is thicker than the plate.
Figure 7:
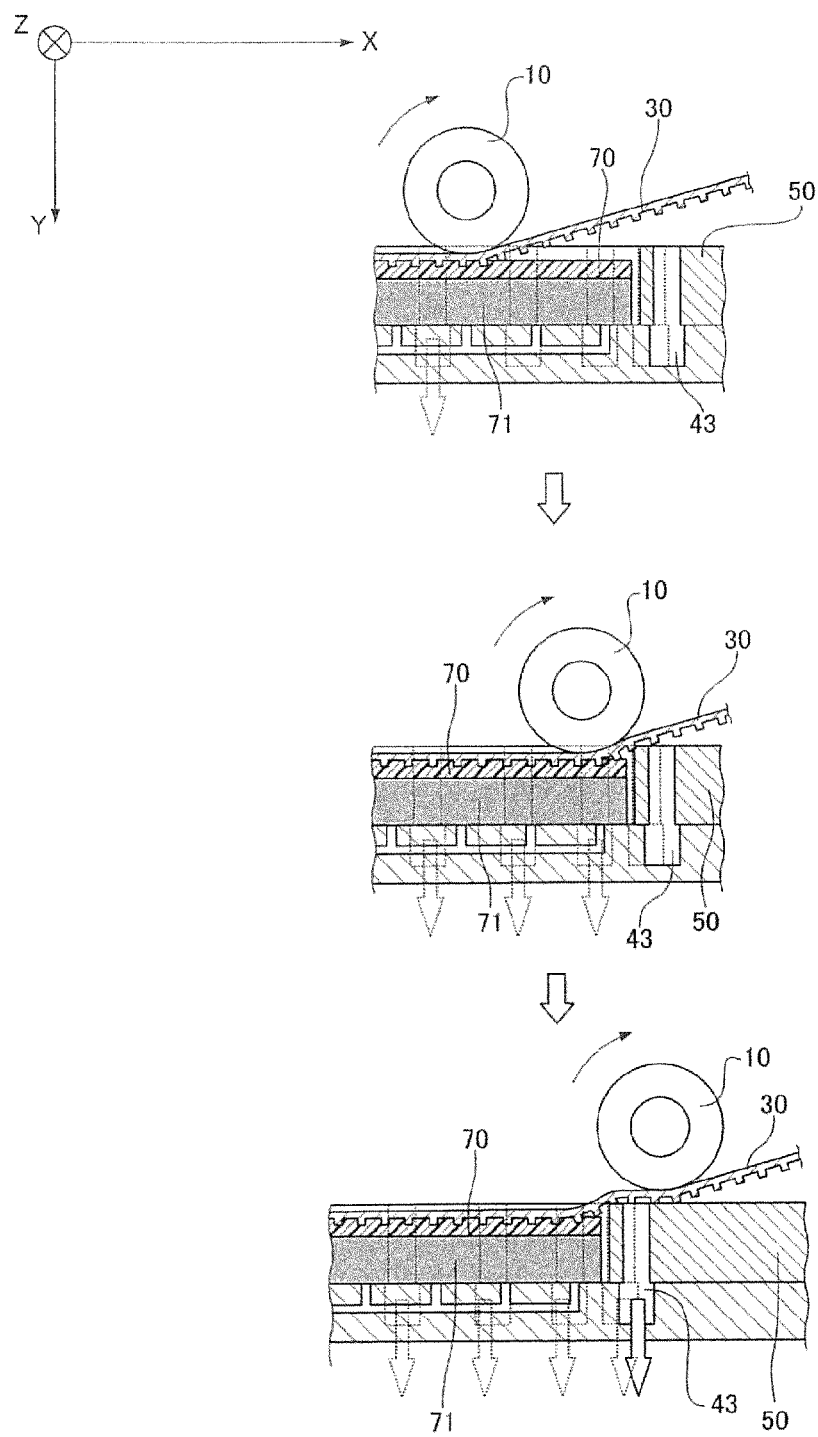
FIG. 7 shows enlarged cross-sectional views of the imprinting device in a case where the substrate is thinner than the plate.

When adopting the imprinting device 1 according to the embodiment, uniform transfer can be realized regardless of the thickness of the substrate 71. For example, in the case where the substrate 71 is thicker than the plate 50 as shown in FIG. 6, the mold 30 is sequentially adsorbed and held by the mold adsorption holes 43 at the time when, or just after the pressing roll 10 passes the step portion, therefore, the bending of the thin-plate mold 30 in the step portion can be suppressed after the pressing roll 10 passes, and the floating of the mold 30 from the UV curing resin 70 can be prevented. Moreover, in the case where the substrate 71 is thinner than the plate 50 as shown in FIG. 7, the mold 30 is sequentially adsorbed and held by the mold adsorption holes 43 at the time when, or just after the pressing roll 10 passes the step portion, therefore, the mold 30 follows the step portion and it is possible to prevent the end portion of the mold 30 from being floated from the UV curing resin 70 after the pressing roll 10 passes. Therefore, it is possible to transfer the fine pattern to the end portion of the substrate 71, which can realize uniform transfer regardless of the thickness of the substrate 71. As the surface of the pressing roll 10 has certain elasticity, the surface of the pressing roll 10 can move along the surface of the substrate 71 even when the substrate 71 is thinner than the plate 40 as shown in FIG. 7.

Next, the UV curing resin 70 is cured by irradiating the UV curing resin 70 with the UV light 61 by using the UV irradiator 60 shown in FIG. 1. As the mold 30 is the material having UV transmittance, the UV light 61 can be applied to the UV curing resin 70 through the mold 30 by applying the UV light 61 toward the stage 40 from the second surface 32 side of the mold 30.

Figure 8:
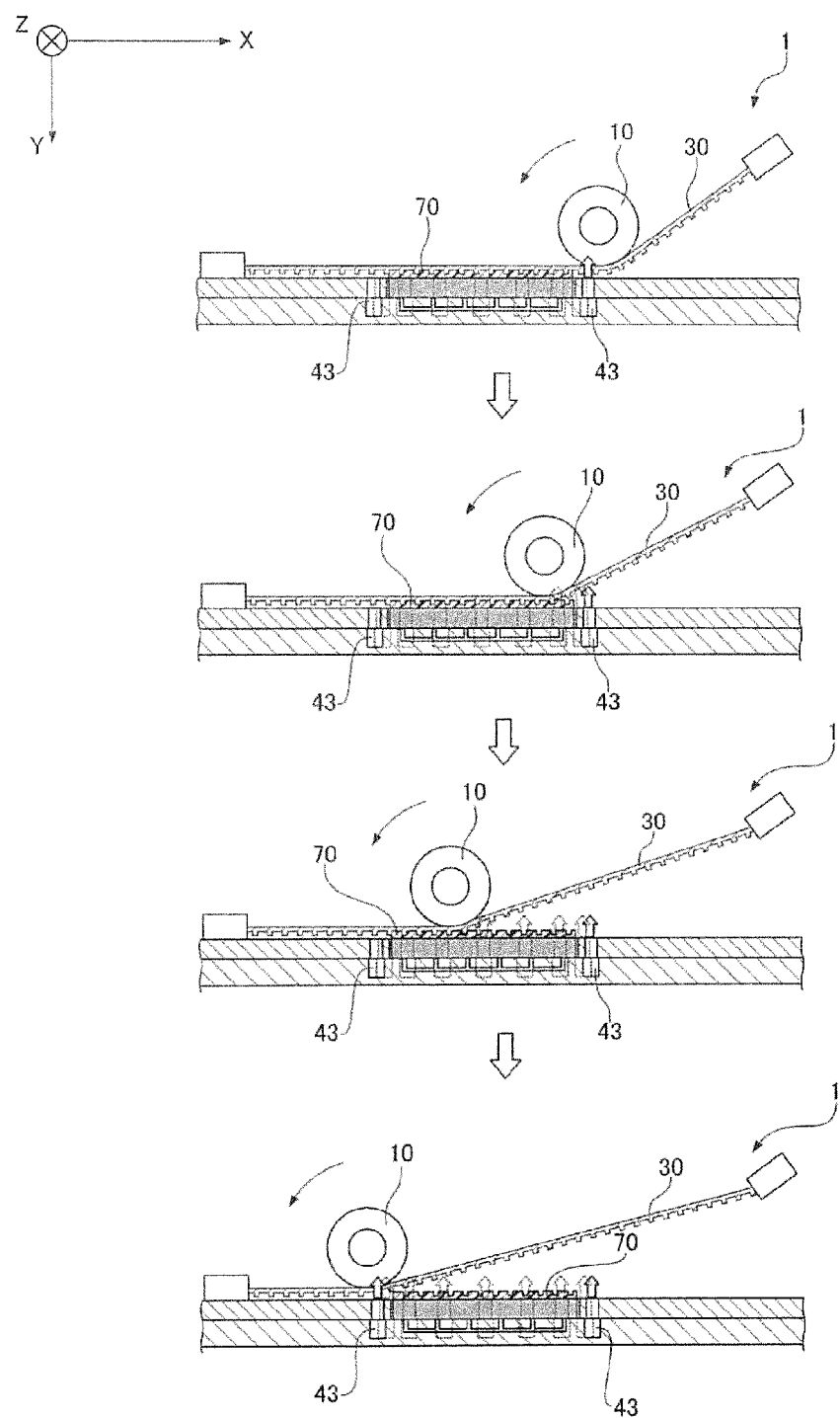
FIG. 8 shows cross-sectional views showing the operation of mold adsorption holes of the imprinting device.
Figure 9:
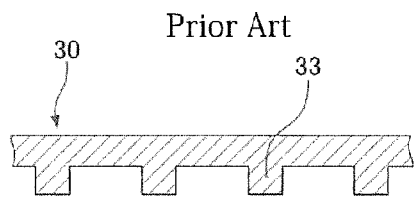
FIG. 9 shows schematic views of a common imprinting technique.
Figure 9:
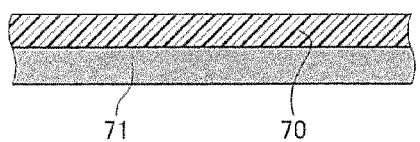
Figure 9:
Figure 9:
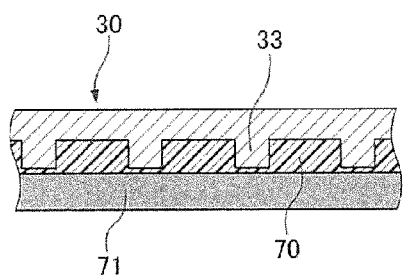
Figure 9:
Figure 9:
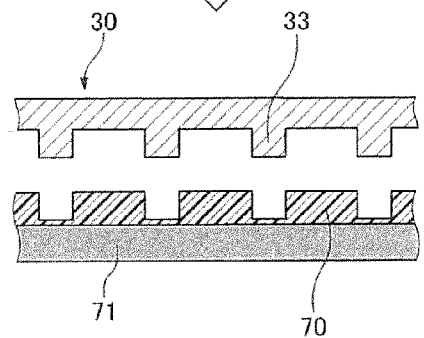
Figure 10:
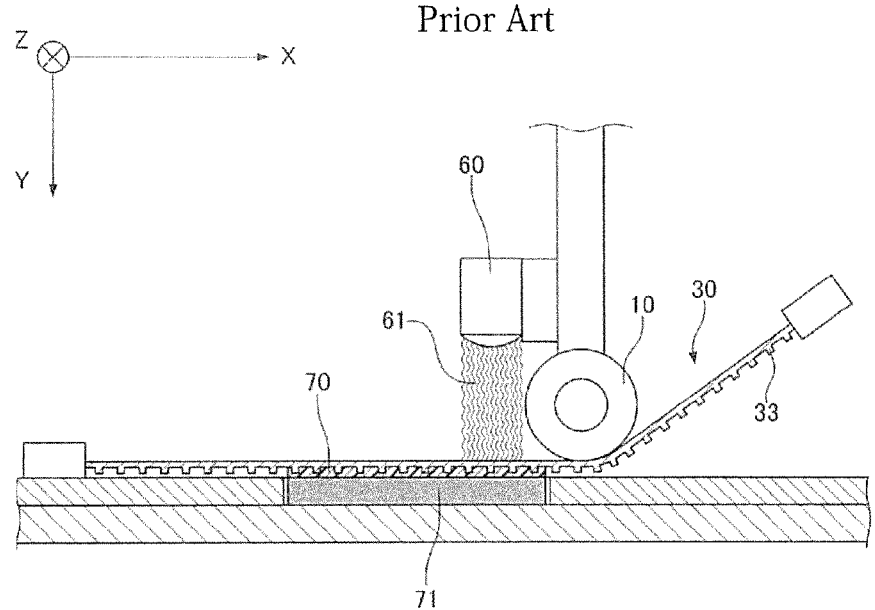
FIG. 10 is a cross-sectional view of an imprinting device described in Patent Document 1.
Figure 11:
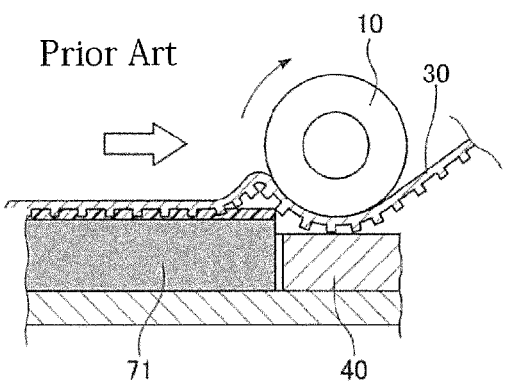
FIG. 11 is an enlarged cross-sectional view of the imprinting device described in Patent Document 1 in a case where the substrate is thicker than the plate.
Figure 11:
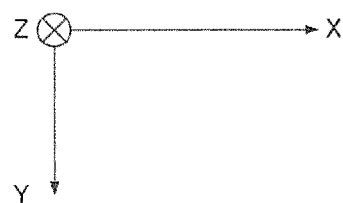
Figure 12:
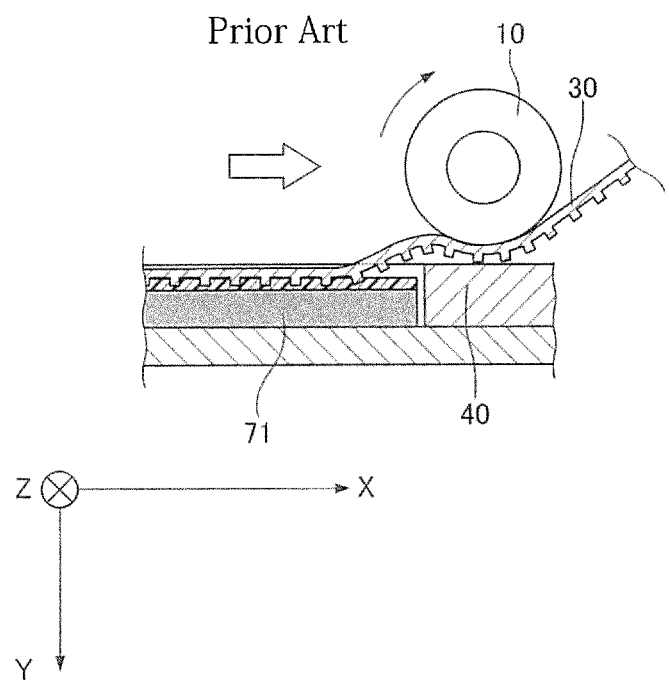
FIG. 12 is an enlarged cross-sectional view of the imprinting device described in Patent Document 1 in a case where the substrate is thinner than the plate.

Lastly, the mold 30 is released from the TV curing resin 70. Specifically, the pressing roll 10 is moved in an opposite direction to the feeding direction X as shown in FIG. 8, and the mold 30 can be peeled off from the UV curing resin 70 by using a tension relating to the mold 30. At this time, it is necessary to stop the adsorption of the mold adsorption holes 43. Furthermore, when the gas can be injected from the mold adsorption holes 43, it is possible to assist the peeling of the mold 30 by injecting the gas sequentially in synchronization with the movement of the pressing roll 10. Specifically, it is desirable that the gas is sequentially injected from the mold adsorption holes 43 at the time when or just after the pressing roll 10 passes. In the case where the flow rate of the gas can be adjusted, the assist force for releasing the mold can be controlled so as to correspond to respective places.

In the imprinting device 1 according to the embodiment, the interval L1 between the center of the shaft 11 of the pressing roll and the center of the shaft 21 of the holding roll 20 is preferably set to be larger than the length L2 of the placement area 41 of the stage 40 as shown in FIG. 1. The holding roll 20 is provided for holding a portion of the mold 30 so as not to be separated from the UV curing resin 70 after the pressing roll 10 passes. When the interval L1 between the center of the shaft 11 of the pressing roll and the center of the shaft 21 of the holding roll 20 is larger than the length L2 of the placement area 41 of the stage 40, the UV light 61 is applied in a state where the substrate 71 exists between the pressing roll 10 and the holding roll 20 when seen from the pressing direction Y, thereby performing irradiation of the UV light 61 at a time.

The imprinting device 1 according to the embodiment is not limited to the cylindrical holding roll 20 in the above description. For example, a holding member not having a cylindrical shape may be used instead of the holding roll 20 as long as the portion of the mold 30 can be held so as not to be separated from the UV curing resin 70 after the pressing roll 10 passes.

Moreover, the imprinting device 1 is not limited to the concave portion by the plate 50 and the stage 40 as in the above description. For example, in the case where the stage 40 has the concave portion, the substrate can be fitted into the concave portion of the stage even when the plate does not exist. In the case where the plate 50 is used, the suitable concave portion can be formed with respect to the substrate 71 having an arbitrary shape and thickness by appropriately selecting a plate having approximately the same as the shape and thickness of the substrate 71.

the imprinting device 1 is not limited to the UV imprinting method explained above. A thermal imprinting method can be also adopted. In the case of the thermal imprinting method, the mold 30 is not limited to the material having UV transmittance. As a material of the transferred object, a thermosetting resin which is softened by being heated to be higher than a glass transition temperature is used instead of the UV curing resin. It is further necessary to have a mechanism for heating and cooling the thermosetting resin instead of the UV irradiator 60. For example, a heater is provided in the stage 40 to thereby heat the thermosetting resin by the heater through the substrate 71, and a cooling flow path is provided in the pressing roll 10 and a cooling water or a cooling gas flows in the cooling flow path to thereby cool the thermosetting resin through the surface of the pressing roll 10 and the mold 30.

The imprinting device 1 is not limited to the substrate adsorption holes 42 described above. For example, the substrate 71 can be held by adhesive bonding. It is preferable to hold the substrate 71 by the substrate adsorption holes 42 as it is easy to release the holding.

In the drawings, the case where the circular substrate 71 seen from the pressing direction Y of the pressing roll 10 is used and the placement area 41 of the stage 40 is also circular is shown, however, the imprinting device 1 is not limited to this. For example, polygonal shapes can be adopted.

The present invention is useful for an imprinting device capable of realizing uniform transfer regardless of the thickness of a substrate.

What is claimed is:

1. An imprinting device comprising:
    a stage having a placement area for placing a substrate to which a transferred object is applied;
    a plate provided in an area except the placement area on the stage and having plural through holes;
    a plate mold with flexibility having a fine pattern on a first surface facing the placement area of the stage, which is held with a predetermined tension; and
    a pressing roll which can press a second surface opposite to the first surface of the mold,
    wherein the stage has plural adsorption holes around the placement area,
    a controller is configured to start adsorption of the adsorption holes in synchronization with movement of the pressing roll,
    wherein the adsorption holes are respectively connected to the through holes of the plate.

2. The imprinting device according to claim 1, further comprising:
    a UV irradiator arranged on the second surface side of the mold and can apply a UV light to the placement area on the stage,
    wherein the mold is a material having UV transmittance.

3. The imprinting device according to claim 1, wherein a gas can be injected from the adsorption holes.

4. The imprinting device according to claim 1, wherein adsorbability of the respective adsorption holes of the stage can be adjusted.

* * * * *